(12) United States Patent
Era et al.

(10) Patent No.: US 9,793,363 B1
(45) Date of Patent: Oct. 17, 2017

(54) GAN SEMICONDUCTOR DEVICE COMPRISING CARBON AND IRON

(71) Applicant: Mitsubishi Electric Corporation, Tokyo (JP)

(72) Inventors: Atsushi Era, Tokyo (JP); Susumu Hatakenaka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/641,017

(22) Filed: Jul. 3, 2017

Related U.S. Application Data

(63) Continuation of application No. 15/156,577, filed on May 17, 2016, now Pat. No. 9,728,611.

(30) Foreign Application Priority Data

Oct. 22, 2015 (JP) ................................. 2015-207848

(51) Int. Cl.
*H01L 29/36* (2006.01)
*H01L 29/20* (2006.01)
(Continued)

(52) U.S. Cl.
CPC .......... *H01L 29/36* (2013.01); *H01L 29/2003* (2013.01); *H01L 29/207* (2013.01); *H01L 29/7788* (2013.01)

(58) Field of Classification Search
CPC ... H01L 29/36; H01L 29/2003; H01L 29/207; H01L 29/68; H01L 29/76; H01L 29/772; H01L 29/778; H01L 29/7788
See application file for complete search history.

(56) References Cited

U.S. PATENT DOCUMENTS 9,029,868 B2   5/2015   Kotani et al.
9,496,349 B2   11/2016  Lutgen et al.
(Continued)

FOREIGN PATENT DOCUMENTS

JP   2011-199222 A   10/2011
JP   2012-033703 A   2/2012
JP   5696392 B2      2/2015

OTHER PUBLICATIONS

Heikman et al.; "Growth of Fe Doped Semi-Insulating GaN by Metalorganic Chemical Vapor Deposition"; Jul. 15, 2002; Applied Physics Letters; vol. 81, No. 3; pp. 439-441.

*Primary Examiner* — Scott B Geyer
(74) *Attorney, Agent, or Firm* — Studebaker & Brackett PC

(57) ABSTRACT

A semiconductor device includes: a substrate; a first GaN layer on the substrate and containing carbon; a second GaN layer on the first GaN layer and containing transition metal and carbon; a third GaN layer on the second GaN layer and containing transition metal and carbon; and an electron supply layer on the third GaN layer and having a larger band gap than GaN. A transition metal concentration of the third GaN layer gradually decreases from that of the second GaN layer from the second GaN layer toward the electron supply layer and is higher than $1 \times 10^{15}$ $cm^{-3}$ at a position of 100 nm deep from a bottom end of the electron supply layer. A top end of the second GaN layer is deeper than 800 nm from the bottom end. A carbon concentration of the third GaN layer is lower than those of the first and second GaN layers.

21 Claims, 3 Drawing Sheets

(51) Int. Cl.
*H01L 29/778* (2006.01)
*H01L 29/207* (2006.01)

(56) References Cited

U.S. PATENT DOCUMENTS

| | | |
|---|---|---|
| 2010/0123169 A1 | 5/2010 | Sato |
| 2012/0025202 A1 | 2/2012 | Makabe et al. |
| 2012/0025203 A1 | 2/2012 | Nakata et al. |
| 2013/0210203 A1 | 8/2013 | Imanishi et al. |
| 2013/0249060 A1 | 9/2013 | Ishibashi |
| 2015/0001582 A1 | 1/2015 | Laboutin et al. |
| 2015/0303293 A1 | 10/2015 | Tanaka et al. |
| 2015/0357416 A1 | 12/2015 | Konno et al. |
| 2015/0380497 A1* | 12/2015 | Briere ................ H01L 21/0237 257/194 |

* cited by examiner

GAN SEMICONDUCTOR DEVICE COMPRISING CARBON AND IRON

BACKGROUND OF THE INVENTION

Field

The present invention relates to a semiconductor device provided with a group III-V nitride semiconductor film such as nitride gallium (GaN).

Background

A group III-V nitride semiconductor film, $Al_xGa_yIn_zN$ (x+y+z=1, y≠0) film in particular, has a high saturation electron speed and a high withstand voltage characteristic, and is therefore used as a material for electronic devices. Among these electronic devices, high electron mobility transistors (HEMT) that generate a high concentration two-dimensional electron gas (2DEG: two-dimensional electron gas) on an interface using a hetero-structure are attracting attention in particular. Hereinafter, a HEMT using an $Al_xGa_yIn_zN$ (x+y+z=1, y=0) film will be referred to as "GaN-based HEMT."

With the GaN-based HEMT, an electron supply layer made of $Al_xGa_yIn_zN$ (x+y+z=1, x>z) having a larger band gap than an electron traveling layer is provided in an electron traveling layer made of $Al_xGa_yIn_zN$ (x+y+z=1, y=0). This makes it possible to generate a high concentration 2DEG through a polarization effect, reduce sheet resistance and obtain high output.

With the GaN-based HEMT, a transition metal such as iron (Fe) or carbon (C) is added to a region lower than the 2DEG region in order to improve a pinch-off characteristic or improve an off-withstand voltage. These dopants form deep levels in the $Al_xGa_yIn_zN$ (x+y+z=1, y=0) layer, and have therefore a characteristic of trapping electrons and the doped region becomes a high resistance region. Here, a good pinch-off characteristic means that a leakage current flowing through a drain while applying a gate voltage that causes the transistor to turn off and applying a source-drain voltage (e.g., operating voltage) is sufficiently small. On the other hand, a high off-withstand voltage means that while applying a gate voltage that causes the transistor to turn off and applying a large voltage equal to or higher than the operating voltage between the source and drain, the leakage current flowing through the drain is caused to increase, resulting in a high voltage that may lead to a destruction of elements.

Generally, either a transition metal or carbon is selected as a dopant. Regarding this, JP 5696392 A describes that since the energy level of the transition metal is not stable enough, and so carbon as well as the transition metal needs to be added. On the other hand, JP 5696392 A describes that carbon causes a transient response of a current-voltage characteristic represented by current collapse to deteriorate. Based on this, concentration of carbon is changed at a concentration lower than the concentration of the transition metal as in the case of the concentration change of the transition metal (see FIG. 6 of JP 5696392 A). JP 5696392 A considers that it is thereby possible to stabilize the energy level of the transition metal.

However, the method of JP 5696392 A not only adds C (carbon) to the GaN layer into which the transition metal is intentionally added, but also adds C to the GaN layer above where the transition metal is trapped in a sweeping form. For this reason, C extends to the vicinity of the 2DEG, causing a transit response of current-voltage characteristics such as current collapse to deteriorate. There is also a problem that it is not possible to sufficiently improve both the pinch-off characteristic and the off-withstand voltage. That is, an intrinsic question as to what kind of doping is necessary to improve the pinch-off characteristic and the off-withstand voltage is yet to be defined, failing to become an optimum structure. Furthermore, the amount of added C is generally controlled by growth conditions such as a growth temperature and pressure. Therefore, to gradually lower the concentration of the amount of added C as in the case of the transition metal, it is necessary to realize growth while gradually changing the growth temperature or the pressure. For this reason, not only a huge constraint may be imposed on the growth condition but also the growth is realized while gradually changing the growth speed, making it very difficult to perform film thickness management. Thus, according to the method described in JP 5696392 A, it is not possible to optimize all of the pinch-off characteristic, off-withstand voltage and transient response, and it is also difficult to implement stable production.

SUMMARY

The present invention has been implemented to solve the above-described problems and it is an object of the present invention to provide a semiconductor device capable of optimizing all of the pinch-off characteristic, off-withstand voltage and transient response.

According to the present invention, a semiconductor device includes: a substrate; a first GaN layer on the substrate and containing carbon; a second GaN layer on the first GaN layer and containing transition metal and carbon; a third GaN layer on the second GaN layer and containing transition metal and carbon; and an electron supply layer on the third GaN layer and having a larger band gap than GaN, wherein a transition metal concentration of the third GaN layer gradually decreases from a transition metal concentration of the second GaN layer from the second GaN layer toward the electron supply layer and is higher than $1\times10^{15}$ $cm^{-3}$ at a position of 100 nm deep from a bottom end of the electron supply layer, a top end of the second GaN layer is deeper than 800 nm from the bottom end of the electron supply layer, and a carbon concentration of the third GaN layer is lower than carbon concentrations of the first and second GaN layers.

In the present invention, a transition metal concentration of the third GaN layer is higher than $1\times10^{15}$ $cm^{-3}$ at a position of 100 nm deep from a bottom end of the electron supply layer, a top end of the second GaN layer containing carbon is deeper than 800 nm from the bottom end of the electron supply layer, and a carbon concentration of the third GaN layer is lower than carbon concentrations of the first and second GaN layers. It is therefore possible to optimize all of the pinch-off characteristic, off-withstand voltage and transient response.

Other and further objects, features and advantages of the invention will appear more fully from the following description.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
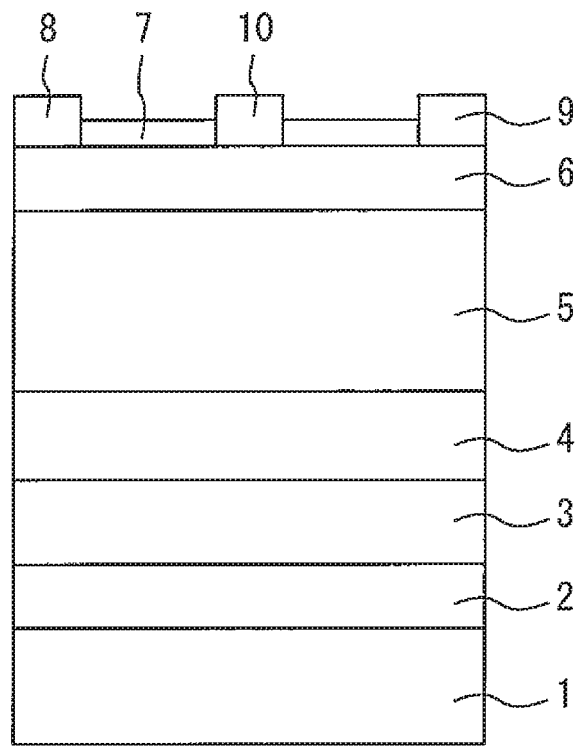
FIG. 1 is a cross-sectional view illustrating a semiconductor device according to a first embodiment of the present invention.

FIG. 1 is a cross-sectional view illustrating a semiconductor device according to a first embodiment of the present invention. This semiconductor device is a GaN-based HEMT.

An AlN nucleation layer 2 is provided on an SiC substrate 1. A GaN layer 3 containing C having a concentration of, for example, $5 \times 10^{16}$ cm$^{-3}$ is provided on the AlN nucleation layer 2. A GaN layer 4 containing C having a concentration of, for example, $5 \times 10^{16}$ cm$^{-3}$ and Fe having a concentration of, for example, $5.0 \times 10^{17}$ cm$^{-3}$ is formed on the GaN layer 3. A GaN layer 5 containing Fe and C is provided on the GaN layer 4.

An electron supply layer 6 made of Al$_x$Ga$_y$In$_z$N (x+y+z=1, x>z, for example, x=0.2, y=0.8, z=0) having a larger band gap than GaN is provided on the GaN layer 5. Here, the electron supply layer 6 need not be a single layer, but may have a two-layer structure in which an AlGaN layer is laminated on the AlN layer. In this case, the AlN layer and the AlGaN layer are collectively regarded as the electron supply layer 6. The Fe concentration of the GaN layer 5 gradually decreases from the Fe concentration of the GaN layer 4 from the GaN layer 4 toward the electron supply layer 6.

For example, an SiN protective film 7 is provided on the electron supply layer 6. A source electrode 8, a drain electrode 9 and a gate electrode 10 are provided on the electron supply layer 6 exposed from the SiN protective film 7.

Here, the inventor has found that it is necessary to adopt a high-resistance layer for a portion relatively close to the bottom end of the electron supply layer 6 in order to improve a pinch-off characteristic. Furthermore, a dopant used for this purpose must be a transition metal because the dopant is applied to the portion relatively close to the electron supply layer 6 and use of carbon as the dopant may cause deterioration of transient response such as current collapse. The inventor has also found that it is necessary to set the content of transition metal at a position of 100 nm deep from the bottom end of the electron supply layer 6 to be higher than $1 \times 10^{15}$ cm$^{-3}$.

The inventor has further found that C needs to be added to improve an off-withstand voltage and that C, even when added to a location far from the electron supply layer 6, exhibits an effect, and that C added to a location far from the electron supply layer 6 does not cause deterioration of a transient response such as current collapse. More specifically, the inventor has found that it is necessary to contain carbon at any given location deeper than 800 nm from the bottom end of the electron supply layer 6.

The inventor has also found that in the layer to which both C and Fe are added, since the presence of Fe causes a position and a coupling state of C in a crystal to change compared to the layer to which only C is added, the amount of C contributing to an improvement of an off-withstand voltage decreases, that is, the off-withstand voltage improving effect of C itself is lessened. Based on this fact, the inventor has found that it is effective to provide a layer containing only C without adding Fe in order to fully exhibit the off-withstand voltage improving effect of C.

Thus, the present embodiment sets the Fe concentration of the GaN layer 5 to be higher than $1 \times 10^{15}$ cm$^{-3}$ at a position of 100 nm deep from the bottom end of the electron supply layer 6. The top end of the C-containing GaN layer 4 is made to be deeper than 800 nm from the bottom end of the electron supply layer 6. Moreover, the C concentration of the GaN layer 5 is made to be lower than the C concentrations of the GaN layers 3 and 4. This makes it possible to optimize all of the pinch-off characteristic, off-withstand voltage and transient response.

Next, a method for manufacturing a semiconductor device according to the present embodiment will be described. The AlN nucleation layer 2 is made to grow to 50 nm on the SiC substrate 1 using, for example, a metal organic chemical vapor deposition (MOCVD) method.

The GaN layer 3 containing C having a concentration of, for example, $5 \times 10^{16}$ cm$^{-3}$ is made to grow to 200 nm on the AlN nucleation layer 2. A growth condition is assumed to be, for example, a temperature of 1050° C., a pressure of 50 mbar and a V/III ratio of 250. Note that the temperature, pressure and V/III ratio may be adjusted so as to obtain a desired C concentration and a dopant gas of C such as CBr$_4$ may be supplied.

The GaN layer 4 containing C having a concentration of, for example, $5 \times 10^{16}$ cm$^{-3}$ and Fe having a concentration of, for example, $5.0 \times 10^{17}$ cm$^{-3}$ is made to grow to 200 nm on the GaN layer 3. The growth condition is assumed to be, for example, a temperature of 1050° C., a pressure of 50 mbar and a V/III ratio of 250. Note that the temperature, pressure and V/III ratio may be adjusted so as to obtain a desired C concentration and a dopant gas of C such as CBr$_4$ may be supplied. Fe is contained by supplying a dopant gas such as Cp$_2$Fe (ferrocene).

Here, the GaN layer 3 and the GaN layer 4 preferably contain C having a concentration higher than $2 \times 10^{16}$ cm$^{-3}$ so as to fully exhibit the off-withstand voltage improving effect. It is also preferable to contain C having a concentration higher than $5 \times 10^{16}$ cm$^{-3}$ in order to further improve the off-withstand voltage. On the other hand, a condition with a low temperature, a low pressure and a low V/III ratio is generally required to increase the C concentration, but such a condition may cause deterioration of crystallinity, and it is therefore preferable to select a C concentration within a range in which crystallinity is not drastically worsened in accordance with the substrate used and a buffer layer structure.

The GaN layer 5 is made to grow to 900 nm on the GaN layer 4. The growth condition is assumed to be, for example, a temperature of 1150° C., a pressure of 200 mbar and a V/III ratio of 1500. Here, by setting the C concentration of the GaN layer 5 to be lower than $2 \times 10^{16}$ cm$^{-3}$, it is possible to sufficiently suppress deterioration of the transient response in the current-voltage characteristic represented by current collapse. Furthermore, the C concentration of the GaN layer 5 is preferably reduced to the lowest possible level. A condition with a high temperature, a high pressure and a high V/III ratio may be used for this purpose. However, using excessively high temperature, pressure and V/III ratio may cause surface flatness to deteriorate, and it is therefore preferable to set the condition appropriately within a range in which deterioration of surface flatness does not adversely affect the device characteristic.

The electron supply layer 6 made of $Al_xGa_yIn_zN$ (x+y+z=1, x>z, for example, x=0.2, y=0.8, z=0) is made to grow to 25 nm on the GaN layer 5.

For example, the SiN protective film 7 is formed on the electron supply layer 6. After that, the SiN protective film 7 is patterned and the electron supply layer 6 is exposed. The source electrode 8 and the drain electrode 9 made of, for example, Ti/Al are formed on the exposed electron supply layer 6 using, for example, a vapor deposition method and subjected to annealing. Furthermore, the protective film 7 is patterned and the electron supply layer 6 is exposed. The gate electrode 10 made of, for example, Ni/Au is formed on the exposed electron supply layer 6 using, for example, a vapor deposition method. Through the above-described steps, a semiconductor device according to the first embodiment is formed.

Figure 2:
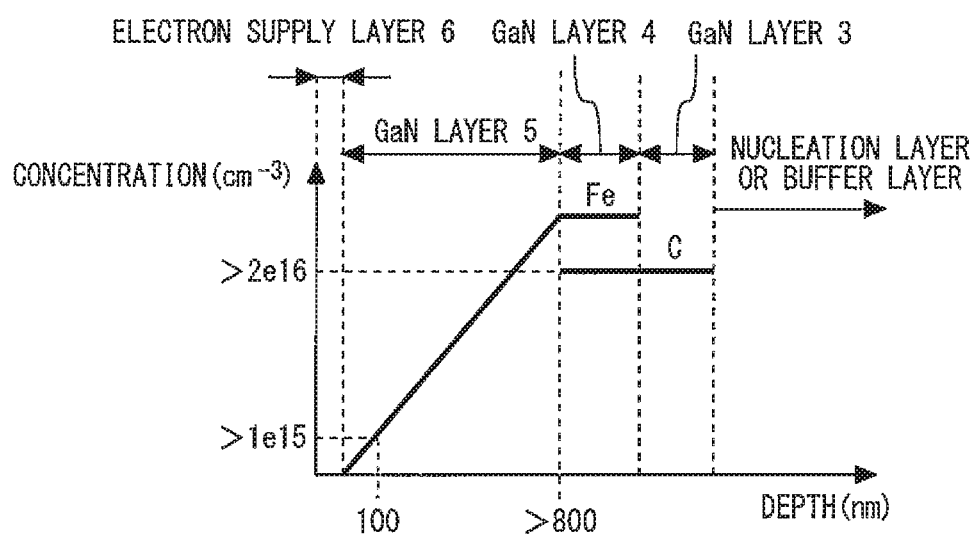
FIG. 2 is a diagram illustrating variations in the Fe concentration and the C concentration with respect to the depth of the semiconductor device according to the first embodiment of the present invention.

FIG. 2 is a diagram illustrating variations in the Fe concentration and the C concentration with respect to the depth of the semiconductor device according to the first embodiment of the present invention. The bottom end of the electron supply layer 6 is assumed to be a depth of 0 nm. Fe is also contained in the GaN layer 5 and the concentration thereof gradually decreases toward the surface. This is mainly attributable to a phenomenon called "surface segregation" specific to Fe in GaN. Note that the gradient of this decrease varies depending on the growth condition or the like.

What is important here is that the content of the transition metal at a position of 100 nm deep from the bottom end of the electron supply layer 6 is set to be higher than $1 \times 10^{15}$ cm$^{-3}$ and that the top end of the C-containing layer is set to be deeper than 800 nm from the bottom end of the electron supply layer. The Fe concentration of the GaN layer 4 and the film thickness of the GaN layer 5 are designed so as to satisfy these conditions as appropriate. In this case, the design is performed by also taking into account crystallinity and control over warpage of the wafer. Since an adverse effect such as a rise of sheet resistance may be caused when Fe is excessively located near the bottom end of the electron supply layer 6, it is preferable to reduce the content of the transition metal at a position of 100 nm deep from the bottom end of the electron supply layer 6 to less than $5 \times 10^{16}$ cm$^{-3}$ and the design is preferably performed accordingly.

Note that in the GaN layer 5, the content of the transition metal at a position of 100 nm deep may be adjusted using a method of supplying a dopant gas such as $Cp_2Fe$ (ferrocene) up to, for example, 200 nm from the bottom end, stopping the supply of the $Cp_2Fe$ there and gradually lowering the Fe concentration for 600 nm above from there.

A cap layer made of a nitride semiconductor such as GaN may be provided on the electron supply layer 6 and each electrode may be provided on the cap layer. A design can be performed as appropriate according to desired device performance by providing an insulating film between the electron supply layer 6 and the gate electrode 10 or between the cap layer and the gate electrode 10. For the substrate 1, not only SiC but also, for example, Si or sapphire may be used. Furthermore, the AlN nucleation layer 2 is an example of the buffer layer for growing the GaN layer above and another $Al_xGa_yIn_zN$ (x+y+z=1) layer may be used or a multi-buffer layer with $Al_xGa_yIn_zN$ (x+y+z=1) layers of a plurality of compositions laminated together may be used or $Al_xGa_yIn_zN$ (x+y+z=1) may be made to grow after providing a material such as SiN on the substrate 1.

In the present embodiment, Fe is assigned the role of improving a pinch-off characteristic and C is assigned the role of improving an off-withstand voltage, and the structure is not such that C is used to stabilize the level of Fe. It is therefore possible to achieve an effect irrespective of which of a maximum content of Fe or a maximum content of C is greater and the maximum content of Fe may be smaller than the maximum content of C.

Second Embodiment

Figure 3:
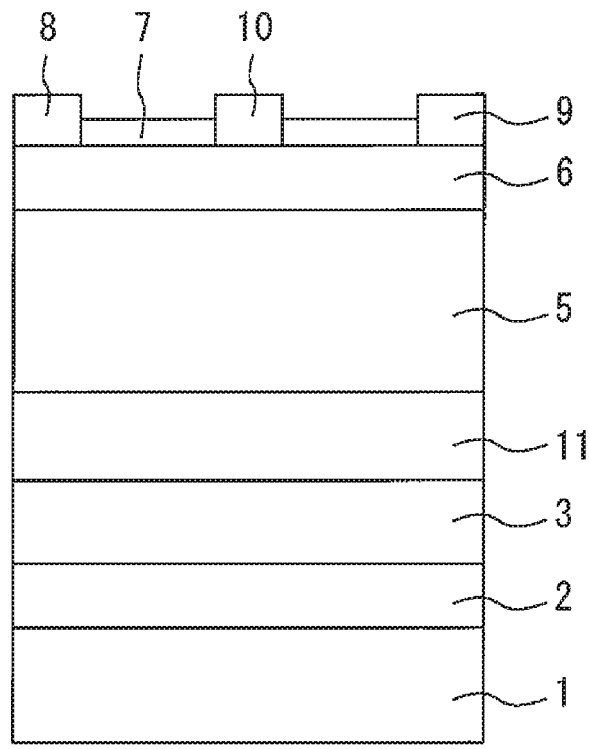
FIG. 3 is a cross-sectional view illustrating a semiconductor device according to a second embodiment of the present invention.

FIG. 3 is a cross-sectional view illustrating a semiconductor device according to a second embodiment of the present invention. Instead of the GaN layer 4 of the first embodiment, a GaN layer 11 is provided which contains Fe having a concentration of, for example, $5.0 \times 10^{17}$ cm$^{-3}$ and C having a concentration of, for example, lower than $2 \times 10^{16}$ cm$^{-3}$. The top end of the C-containing GaN layer 3 is deeper than 800 nm from the bottom end of the electron supply layer 6. The carbon concentrations of the GaN layers 11 and 5 are lower than the carbon concentration of the GaN layer 3. The rest of the configuration is similar to that of the first embodiment.

C having a concentration higher than $2 \times 10^{16}$ cm$^{-3}$ may be preferably contained in the GaN layer 3 so as to fully exhibit the off-withstand voltage improving effect. C having a concentration higher than $5 \times 10^{16}$ cm$^{-3}$ may be preferably contained so as to further exhibit the off-withstand voltage improving effect. The growth condition for the GaN layer 11 may be assumed to be a temperature of 1150° C., a pressure of 200 mbar, a V/III ratio of 1500 and a film thickness of 200 nm, and the C concentration may be set to be lower than $2 \times 10^{16}$ cm$^{-3}$. It is thereby possible to sufficiently suppress deterioration of transient response. Fe is contained by supplying a dopant gas such as $Cp_2Fe$ (ferrocene). With the GaN layer 11 as well as the GaN layer 5, the C concentration is preferably reduced to the lowest possible level and it is preferable to set a growth condition appropriately within a range in which deterioration of the surface flatness has no adverse effect on the device characteristic.

Figure 4:
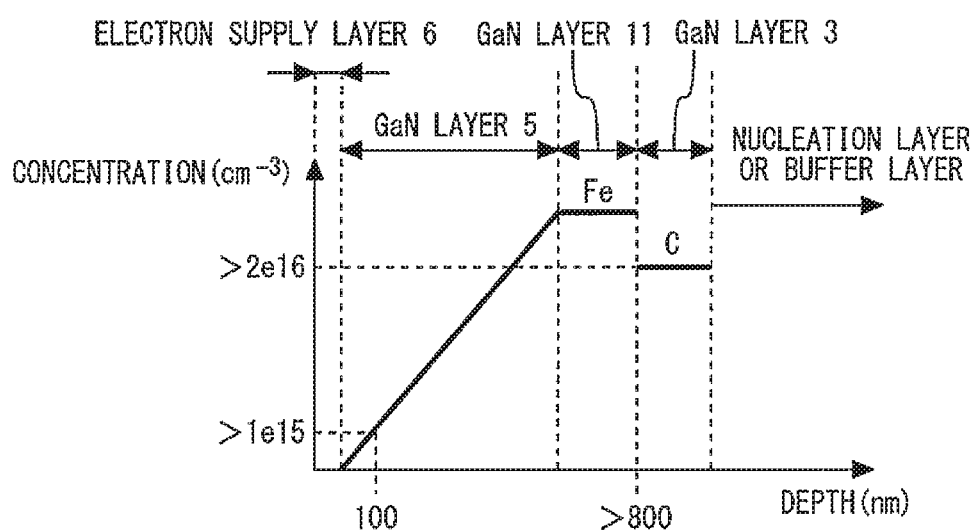
FIG. 4 is a diagram illustrating variations in the Fe concentration and the C concentration with respect to the depth of the semiconductor device according to the second embodiment of the present invention.

FIG. 4 is a diagram illustrating variations in the Fe concentration and the C concentration with respect to the depth of the semiconductor device according to the second embodiment of the present invention. What is important here is that the content of the transition metal at a position of 100 nm deep from the bottom end of the electron supply layer 6 is set to be higher than $1 \times 10^{15}$ cm$^{-3}$ and that the top end of the C-containing layer is deeper than 800 nm from the bottom end of the electron supply layer 6. The Fe concentration and the film thickness of the GaN layer 4, and the film thickness of the GaN layer 5 are designed as appropriate so as to satisfy these conditions. For example, the effects of the present invention can be obtained even when it is assumed that the Fe content of the GaN layer 11 is $1 \times 10^6$ cm$^{-3}$, the film thickness is 500 nm and the film thickness of the GaN layer 5 is 300 nm. Thus, it may be possible to suppress the maximum content of Fe of the GaN layer 11 to be lower than $1 \times 10^{17}$ cm$^{-3}$ to suppress deterioration of surface flatness due to Fe doping to the lowest possible level.

Third Embodiment

Figure 5:
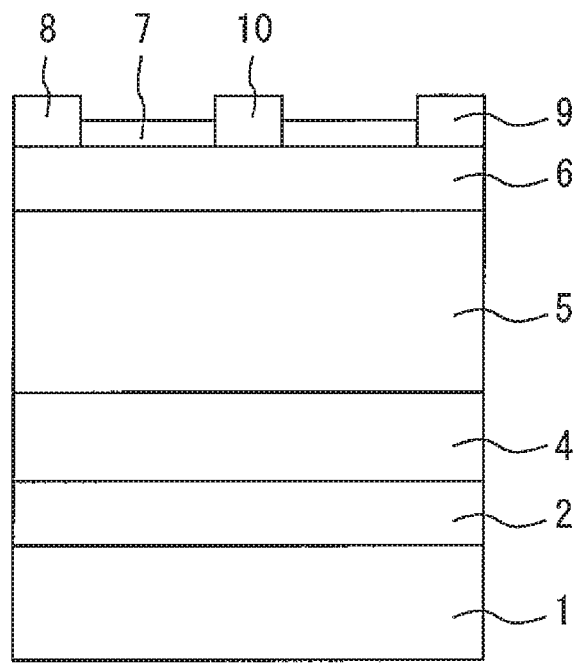
FIG. 5 is a cross-sectional view illustrating a semiconductor device according to a third embodiment of the present invention.
Figure 6:
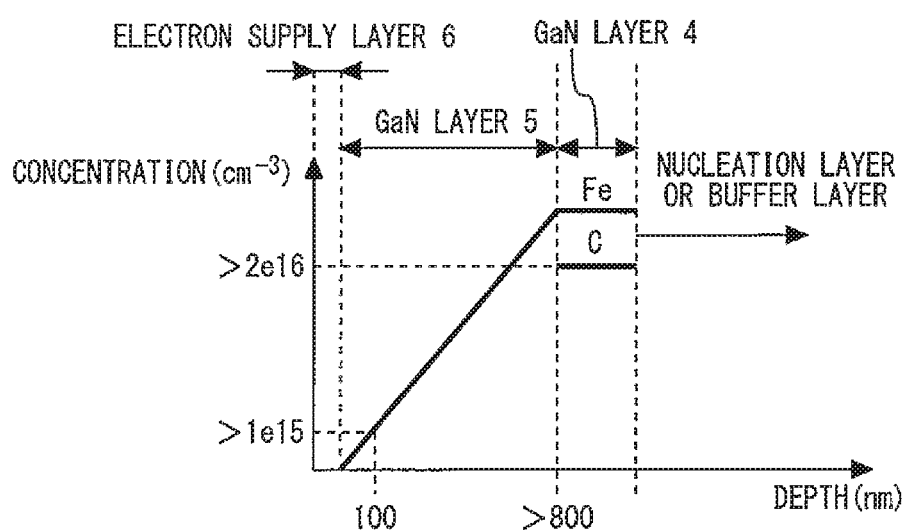
FIG. 6 is a diagram illustrating variations in an Fe concentration and a C concentration with respect to the depth of the semiconductor device according to the third embodiment of the present invention.

FIG. 5 is a cross-sectional view illustrating a semiconductor device according to a third embodiment of the present invention. FIG. 6 is a diagram illustrating variations in an Fe concentration and a C concentration with respect to the depth of the semiconductor device according to the third embodiment of the present invention. Instead of providing the GaN layer 3, the GaN layer 4 is provided directly on the AlN nucleation layer 2 or a buffer layer. The C concentration of the GaN layer 4 is assumed to be, for example, $1 \times 10^{17}$ cm$^{-3}$. The rest of the configuration is similar to that of the first embodiment.

Since the GaN layer 3 is not provided in the present embodiment, it is possible to reduce a total film thickness of all the GaN layers. This is suitable when the total film thickness needs to be reduced to control warpage or when a cost reduction, a lead time reduction or the like is necessary. On the other hand, since there is no layer containing only C, the effect of C is reduced. For this reason, the C concentration of the GaN layer 4 needs to be higher than $2 \times 10^{16}$ cm$^{-3}$ to improve an off-withstand voltage. Moreover, C having a concentration higher than $5 \times 10^{16}$ cm$^{-3}$ is preferably contained to further improve the off-withstand voltage.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-207848, filed on Oct. 22, 2015 including specification, claims, drawings and summary, on which the Convention priority of the present application is based, is incorporated herein by reference in its entirety.

The invention claimed is:

1. A semiconductor device comprising:
a substrate;
a first GaN layer on the substrate and containing carbon;
a second GaN layer on the first GaN layer and containing Fe and carbon;
a third GaN layer on the second GaN layer and containing Fe and carbon; and
an electron supply layer on the third GaN layer and having a larger band gap than GaN,
wherein an Fe concentration of the third GaN layer gradually decreases from an Fe concentration of the second GaN layer from the second GaN layer toward the electron supply layer and is higher than $1 \times 10^{15}$ cm$^{-3}$ at a position of 100 nm deep from a bottom end of the electron supply layer,
a top end of the second GaN layer is deeper than 800 nm from the bottom end of the electron supply layer, and
a carbon concentration of the third GaN layer is lower than carbon concentrations of the first and second GaN layer, and
the Fe concentration of the second GaN layer is equal to or lower than $5 \times 10^{17}$ cm$^{-3}$.

2. The semiconductor device of claim 1, wherein the carbon concentration of the third GaN layer is lower than $2 \times 10^{16}$ cm$^{-3}$.

3. The semiconductor device of claim 1, wherein the carbon concentrations of the first and second GaN layers are higher than $2 \times 10^{16}$ cm$^{-3}$.

4. The semiconductor device of claim 3, wherein the carbon concentrations of the first and second GaN layers are higher than $5 \times 10^{16}$ cm$^{-3}$.

5. A semiconductor device comprising:
a substrate;
a first GaN layer on the substrate and containing carbon;
a second GaN layer on the first GaN layer and containing Fe and carbon;
a third GaN layer on the second GaN layer and containing Fe and carbon; and
an electron supply layer on the third GaN layer and having a larger band gap than GaN,
wherein an Fe concentration of the third GaN layer gradually decreases from an Fe concentration of the second GaN layer from the second GaN layer toward the electron supply layer and is higher than $1 \times 10^{15}$ cm$^{-3}$ at a position of 100 nm deep from a bottom end of the electron supply layer,
a top end of the first GaN layer is deeper than 800 nm from the bottom end of the electron supply layer, and
carbon concentrations of the second and third GaN layers are lower than a carbon concentration of the first GaN layer, and
the Fe concentration of the second GaN layer is equal to or lower than $5 \times 10^{17}$ cm$^{-3}$.

6. The semiconductor device of claim 5, wherein the carbon concentrations of the second and third GaN layers are lower than $2 \times 10^{16}$ cm$^{-3}$.

7. The semiconductor device of claim 5, wherein the Fe concentration of the second GaN layer is lower than $1 \times 10^{17}$ cm$^{-3}$.

8. The semiconductor device of claim 5, wherein the carbon concentration of the first GaN layer is higher than $2 \times 10^{16}$ cm$^{-3}$.

9. The semiconductor device of claim 5, wherein the carbon concentration of the first GaN layer is higher than $5 \times 10^{16}$ cm$^{-3}$.

10. A semiconductor device comprising:
a substrate;
a first GaN layer on the substrate and containing carbon;
a second GaN layer on the first GaN layer and containing Fe and carbon;
a third GaN layer on the second GaN layer and containing Fe and carbon; and
an electron supply layer on the third GaN layer and having a larger band gap than GaN,
wherein an Fe concentration of the third GaN layer gradually decreases from an Fe concentration of the second GaN layer from the second GaN layer toward the electron supply layer and is higher than $1 \times 10^{15}$ cm$^{-3}$ at a position of 100 nm deep from a bottom end of the electron supply layer,
a top end of the first GaN layer is deeper than 500 nm from the bottom end of the third GaN layer, and
a top end of the second GaN layer is deeper than 300 nm from the bottom end of the electron supply layer, and
carbon concentrations of the second and third GaN layers are lower than a carbon concentration of the first GaN layer.

11. The semiconductor device of claim 10, wherein the carbon concentrations of the second and third GaN layers are lower than $2 \times 10^{16}$ cm$^{-3}$.

12. The semiconductor device of claim 11, wherein the Fe concentration of the second GaN layer is lower than $1 \times 10^{17}$ cm$^{-3}$.

13. The semiconductor device of claim 12, wherein the carbon concentration of the first GaN layer is higher than $2 \times 10^{16}$ cm$^{-3}$.

14. The semiconductor device of claim 13, wherein the carbon concentration of the first GaN layer is higher than $5 \times 10^{16}$ cm$^{-3}$.

15. A semiconductor device comprising:
a substrate;
a first GaN layer on the substrate and containing Fe and carbon;
a second GaN layer on the first GaN layer and containing Fe and carbon; and an electron supply layer on the second GaN layer and having a larger band gap than GaN, wherein a Fe concentration of the second GaN layer gradually decreases from an Fe concentration of the first GaN layer from the first GaN layer toward the electron supply layer and is higher than $1 \times 10^{15}$ cm$^{-3}$ at a position of 100 nm deep from a bottom end of the electron supply layer, a carbon concentration of the first GaN layer is equal to or higher than $1 \times 10^{17}$ cm$^{-3}$, a top end of the first GaN layer is deeper than 800 nm from the bottom end of the electron supply layer, and a carbon concentration of the second GaN layer is lower than the carbon concentration of the first GaN layer.

16. The semiconductor device of claim 15, wherein the carbon concentration of the second GaN layer is lower than $2 \times 10^{16}$ cm$^{-3}$.

17. A semiconductor device comprising:

a substrate;

a GaN layer on the substrate and containing Fe and carbon; and an electron supply layer on the GaN layer and having a larger band gap than GaN, wherein a Fe concentration of the GaN layer at a position of 100 nm deep from a bottom end of the electron supply layer is higher than $1 \times 10^{15}$ cm$^{-3}$, the GaN layer includes a first region located between the bottom end of the electron supply layer and a position of 800 nm deep from the bottom end of the electron supply layer, and a second region located deeper than 800 nm from the bottom end of the electron supply layer, a carbon concentration of the first region is lower than $2 \times 10^{16}$ cm$^{-3}$, and a carbon concentration of the second region is higher than $2 \times 10^{16}$ cm$^{-3}$.

18. The semiconductor device of claim 17, wherein the second region includes a third region containing Fe.

19. The semiconductor device of claim 18, wherein the second region includes a fourth region not containing Fe and located between the substrate and the third region.

20. The semiconductor device of claim 19, wherein a Fe concentration of the third region is lower than $1 \times 10^{17}$ cm$^{-3}$.

21. The semiconductor device of claim 17, wherein the second region includes a region located deeper than 800 nm from the bottom end of the electron supply layer and having a carbon concentration higher than $5 \times 10^{16}$ cm$^{-3}$.

* * * * *